United States Patent
Yoo et al.

(10) Patent No.: US 10,396,248 B2
(45) Date of Patent: Aug. 27, 2019

(54) SEMICONDUCTOR LIGHT EMITTING DIODE

(71) Applicant: LUMENS CO., LTD., Yongin-si, Gyeonggi-do (KR)

(72) Inventors: Tae Kyung Yoo, Yongin-si (KR); Dae Won Kim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 90 days.

(21) Appl. No.: 15/488,689

(22) Filed: Apr. 17, 2017

(65) Prior Publication Data
US 2018/0301596 A1 Oct. 18, 2018

(51) Int. Cl.
*H01L 33/38* (2010.01)
*H01L 33/40* (2010.01)
*H01L 33/42* (2010.01)
*H01L 33/46* (2010.01)
*H01L 33/62* (2010.01)

(52) U.S. Cl.
CPC .......... *H01L 33/387* (2013.01); *H01L 33/42* (2013.01); *H01L 33/46* (2013.01); *H01L 33/38* (2013.01)

(58) Field of Classification Search
CPC ....... H01L 33/387; H01L 33/62; H01L 33/46; H01L 33/42; H01L 33/405; H01L 33/38
See application file for complete search history.

(56) References Cited

U.S. PATENT DOCUMENTS

| 5,659,226 A * | 8/1997 | Shigeta ............... H01J 11/12 313/491 |
| 6,078,064 A * | 6/2000 | Ming-Jiunn ........... H01L 33/42 257/101 |
| 7,622,746 B1 * | 11/2009 | Lester .................... H01L 33/46 257/98 |
| 8,148,736 B2 * | 4/2012 | Yahata .................. H01L 33/387 257/79 |

(Continued)

FOREIGN PATENT DOCUMENTS

| JP | 2006-128227 | * 5/2006 | ............. H01L 33/00 |
| JP | 2010-087282 A | 4/2010 | |

(Continued)

*Primary Examiner* — Mary A Wilczewski
(74) *Attorney, Agent, or Firm* — Mei & Mark LLP

(57) ABSTRACT

A semiconductor light emitting diode is disclosed. The semiconductor light emitting diode includes a first conductive semiconductor layer, a second conductive semiconductor layer, an active layer disposed between the first conductive semiconductor layer and the second conductive semiconductor layer, a transparent electrode formed on the second conductive semiconductor layer, a non-conductive reflection film covering the circumferential surface of the transparent electrode and having one or more via-holes formed therein, a reflective electrode formed on the non-conductive reflection film, interconnection electrodes filled in the via-holes and electrically connecting the reflective electrode to the transparent electrode, and ohmic contact layers formed between the transparent electrode and the interconnection electrodes and filled in recesses formed at (Continued)

positions of the transparent electrode corresponding to the via-holes by etching or extending through the via-holes from the recesses.

10 Claims, 8 Drawing Sheets

(56) References Cited

U.S. PATENT DOCUMENTS

| | | | | |
|---|---|---|---|---|
| 8,525,204 | B2* | 9/2013 | Fukshima | H01L 33/387 257/98 |
| 9,406,846 | B2* | 8/2016 | Song | H01L 33/44 |
| 10,147,849 | B2* | 12/2018 | Xu | H01L 33/38 |
| 2005/0224816 | A1* | 10/2005 | Kim | H01L 33/22 257/79 |
| 2006/0091406 | A1* | 5/2006 | Kaneko | G02F 1/133603 257/81 |
| 2006/0092634 | A1* | 5/2006 | Hiyama | G09F 13/22 362/231 |
| 2009/0028202 | A1* | 1/2009 | Jeong | H01L 33/02 372/45.01 |
| 2009/0039374 | A1* | 2/2009 | Yahata | H01L 33/387 257/98 |
| 2011/0062479 | A1* | 3/2011 | Sugano | H01L 33/0095 257/98 |
| 2012/0074441 | A1* | 3/2012 | Seo | H01L 27/153 257/91 |
| 2017/0170364 | A1* | 6/2017 | Jeon | H01L 33/405 |

FOREIGN PATENT DOCUMENTS

| | | | | |
|---|---|---|---|---|
| JP | 2011-086909 A | | 4/2011 | |
| JP | 2011-187958 A | | 9/2011 | |
| JP | 2013-168444 A | | 8/2013 | |
| JP | 2014-044971 A | | 3/2014 | |
| JP | 2014-093509 A | | 5/2014 | |
| JP | 2015-167248 A | | 9/2015 | |
| KR | 2006072391 | * | 6/2006 | H01L 33/00 |
| WO | WO2011162367 A1 | | 12/2011 | |

* cited by examiner

SEMICONDUCTOR LIGHT EMITTING DIODE

TECHNICAL FIELD

The present invention is related to a semiconductor light emitting diode with reduced electrical contact resistance and improved luminous efficiency.

BACKGROUND ART

A light emitting diode is a device that converts electrical energy into light energy. When a forward voltage is applied to a light emitting diode including an n-type semiconductor layer and a p-type semiconductor layer, electrons from the n-type semiconductor layer combine with holes from the p-type semiconductor layer, and as a result, energy corresponding to the band gap energy between the conduction band and the valence band is usually released in the form of heat or light.

Various types of compound semiconductors are used in the fabrication of light emitting diodes that produce various colors. Particularly, nitride semiconductors are extensively used in the field of photonic device and high power electronic device development due to their good thermal stability and wide band gap energy.

Commercial light emitting diodes using nitride semiconductors are now widely used. Such light emitting diodes include blue light emitting diodes, green light emitting diodes, and ultraviolet (UV) light emitting diodes. With the recent increasing demand for highly efficient LEDs, an improvement in luminous efficiency is emerging as a major issue.

DISCLOSURE OF THE INVENTION

Problems to be Solved by the Invention

The present invention has been made in view of the above problems, and an object of the present invention is to provide a semiconductor light emitting diode with high luminous efficiency including a highly conductive p-type electrode layer.

Means for Solving the Problems

A semiconductor light emitting diode according to one aspect of the present invention includes a first conductive semiconductor layer, a second conductive semiconductor layer, an active layer disposed between the first conductive semiconductor layer and the second conductive semiconductor layer, a transparent electrode formed on the second conductive semiconductor layer, a non-conductive reflection film covering the circumferential surface of the transparent electrode and having one or more via-holes formed therein, a reflective electrode formed on the non-conductive reflection film, interconnection electrodes filled in the via-holes and electrically connecting the reflective electrode to the transparent electrode, and ohmic contact layers formed between the transparent electrode and the interconnection electrodes.

According to one embodiment, the ohmic contact layers are filled in recesses formed at positions of the transparent electrode corresponding to the via-holes by etching or extend through the via-holes from the recesses.

According to one embodiment, the semiconductor light emitting diode further includes connection electrodes formed between the transparent electrode and the interconnection electrodes.

According to one embodiment, each of the connection electrodes further includes an ohmic contact layer formed at the interface with the corresponding interconnection electrode.

According to one embodiment, when an outer lead frame made of or plated with copper or gold is provided, the reflectance of the non-conductive reflection film for light at a wavelength of 400 nm is at least 80%.

According to one embodiment, the non-conductive reflection film includes $TiO_2$ distributed Bragg reflectors (DBRs) and $SiO_2$ distributed Bragg reflectors stacked alternately.

According to one embodiment, one of the pairs of distributed Bragg reflectors has a thickness of 40 to 200 nm to reflect UV light emitted from the active layer.

According to one embodiment, the transparent electrode includes ITO, ZnO or a metal layer having a transmittance of at least 90% for light at a wavelength of 400 nm.

According to one embodiment, the transparent electrode has a thickness of 20 to 500 nm and contains at least one of nickel (Ni), titanium (Ti), tungsten (W), silver (Ag), chromium (Cr), palladium (Pd), and molybdenum (Mo).

According to one embodiment, the transparent electrode has an uneven surface formed at the interface with the non-conductive reflection film.

According to one embodiment, the uneven surface of the transparent electrode is formed at the interface with the non-conductive reflection film other than the contact areas between the transparent electrode and the interconnection electrodes.

According to one embodiment, the non-conductive reflection film is composed of a light-transmitting material including at least one compound selected from $Si_xO_y$ (where x and y are positive integers), $Ti_mO_n$ (where m and n are positive integers), $Ta_2O_5$, and $MgF_2$.

According to one embodiment, the second conductive semiconductor layer has an uneven surface formed at the interface with the transparent electrode.

According to one embodiment, the semiconductor light emitting diode further includes an n-type electrode unit arranged on the first conductive semiconductor layer.

According to one embodiment, the n-type electrode unit includes an n-type electrode insulating layer, n-type electrodes filled in via-holes formed in the n-type electrode insulating layer, and an n-type bonding member arranged over the n-type electrode insulating layer and the n-type electrodes.

According to one embodiment, the n-type electrodes and the interconnection electrodes are aligned in a matrix structure.

According to one embodiment, the n-type electrodes and the interconnection electrodes form an engaged structure.

A semiconductor light emitting diode according to a further aspect of the present invention includes a first conductive semiconductor layer having an upper surface and a lower surface, a second conductive semiconductor layer spaced apart from the upper surface of the first conductive semiconductor layer, an active layer disposed between the upper surface of the first conductive semiconductor layer and the second conductive semiconductor layer, a transparent electrode formed on the second conductive semiconductor layer, a non-conductive reflection film covering the circumferential surface of the transparent electrode and having one or more via-holes formed therein, a first conductive electrode pad formed on the lower surface of the first conductive semiconductor layer, a second conductive electrode pad formed on the non-conductive reflection film, interconnection electrodes filled in the via-holes and electrically connecting the second conductive electrode pad to the transparent electrode, and ohmic contact layers formed between the transparent electrode and the interconnection electrodes.

According to one embodiment, the ohmic contact layers are filled in recesses formed at positions of the transparent electrode corresponding to the via-holes by etching or extend through the via-holes from the recesses.

According to one embodiment, the semiconductor light emitting diode further includes a passivation layer covering one side of the first conductive semiconductor layer, one side of the active layer, one side of the second conductive semiconductor layer, one side of the transparent electrode, and one side of the non-conductive reflection film.

Effects of the Invention

In the embodiments of the semiconductor light emitting diode according to the present invention, the interconnection electrodes filled in the via-holes and the ohmic contact layers formed between the interconnection electrodes and the transparent electrode ensure increased conductivity, achieving maximum luminous efficiency of the semiconductor light emitting diode.

In addition, the formation of the non-conductive reflection film with high reflectance for light in the UV region contributes to excellent light output characteristics of the semiconductor light emitting diode. Excellent light output characteristics of the semiconductor light emitting diode can be obtained also when a lead frame plated with copper or gold is provided.

Furthermore, ohmic contacts are formed between the transparent electrode composed of a conductive oxide and the interconnection electrodes composed of a metal material and defects are minimized during fabrication of the semiconductor light emitting diode, achieving good bonding between the transparent electrode and the interconnection electrodes.

DETAILED DESCRIPTION FOR CARRYING OUT THE INVENTION

Figure 1:
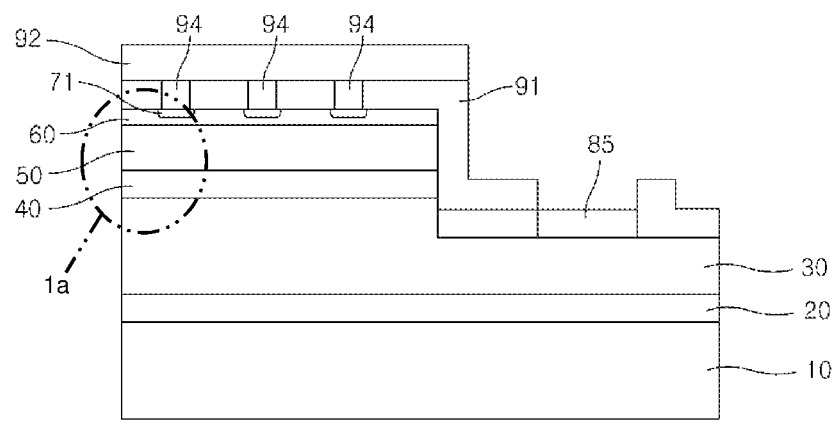
FIG. 1 is a cross-sectional view of a first embodiment of a semiconductor light emitting diode according to the present invention.
Figure 1A:
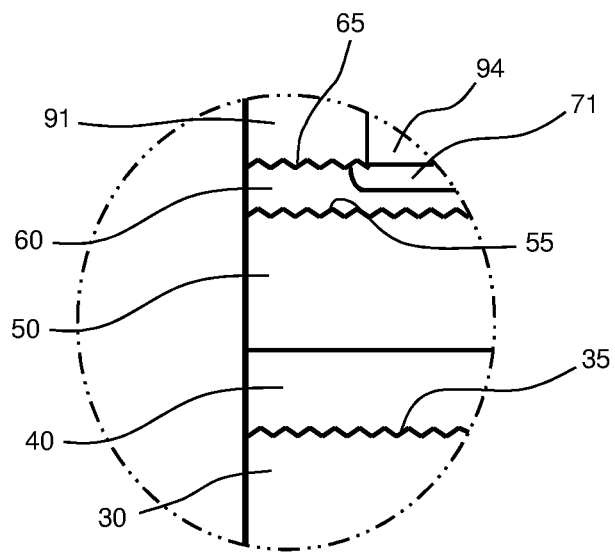
FIG. 1A is an exploded view of circular section 1a of FIG. 1, according to one exemplary embodiment.

Preferred embodiments of a semiconductor light emitting diode according to the present invention will now be described with reference to the accompanying drawings. The same elements are denoted by the same or similar reference numerals even though they are depicted in different embodiments and a repeated explanation of such elements is omitted in this description. It should be understood that the dimensions of elements in the drawings are exaggerated for descriptive convenience and do not entirely reflect their actual dimensions.

Figure 2:
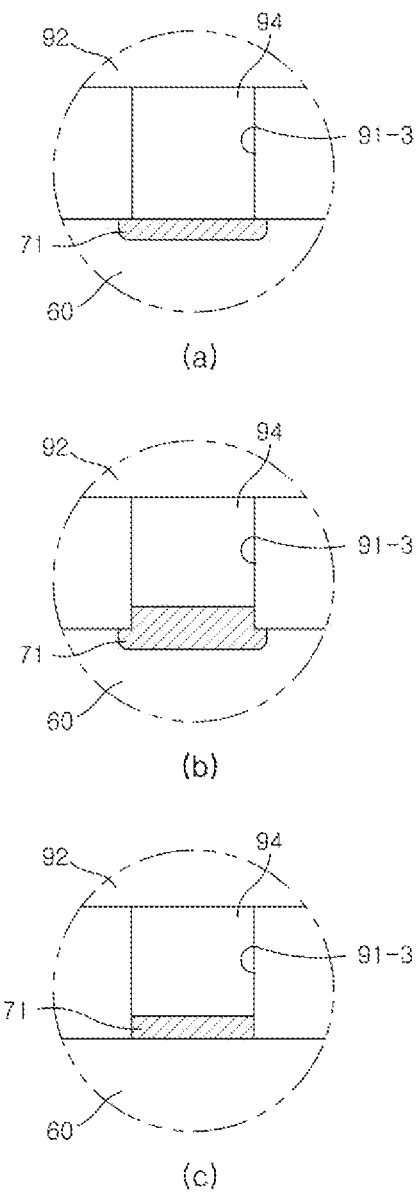
FIG. 2 illustrates enlarged cross-sectional views for explaining structures in which interconnection electrodes are connected to a transparent electrode in FIG. 1.

FIG. 1 is a cross-sectional view of a first embodiment of a semiconductor light emitting diode according to the present invention and FIG. 2 illustrates enlarged cross-sectional views for explaining structures in which interconnection electrodes 94 are connected to a transparent electrode 60 in FIG. 1.

As illustrated in FIGS. 1 and 2, the first embodiment of the semiconductor light emitting diode according to the present invention may include a substrate 10, a buffer layer 20, an n-type semiconductor layer as a first conductive semiconductor layer 30, an active layer 40, a p-type semiconductor layer as a second conductive semiconductor layer 50, a transparent electrode 60, ohmic contact layers 71, an n-type bonding pad 85, a non-conductive reflection film 91 having via-holes 91-3, and a reflective electrode 92.

Figure 5:
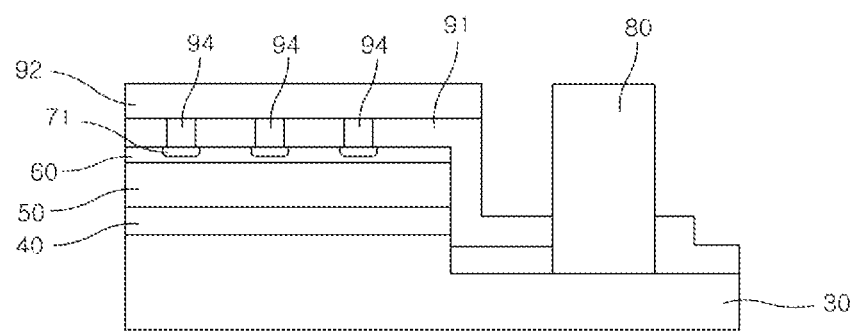
FIG. 5 is a cross-sectional view of a third embodiment of a semiconductor light emitting diode according to the present invention.

The substrate 10 is usually composed of sapphire ($Al_2O_3$), SiC, Si, GaN or glass. When the light emitting diode is of a flip type, the substrate 10 may be removed from the final structure (FIG. 5). Also when the light emitting diode is of a vertical type, the substrate 10 may be removed from the final structure (see FIG. 10 or 12). The vertical-type light emitting diode is described below.

The buffer layer 20 is provided to facilitate the growth of the first conductive semiconductor layer on the substrate 10. The buffer layer 20 may be omitted depending on the kind of the substrate 10.

The n-type first conductive semiconductor layer 30 is laminated on the buffer layer 20, the active layer 40 is laminated on the first conductive semiconductor layer 30, and the p-type second conductive semiconductor layer 50 is laminated on the active layer 40. That is, the active layer 40 is disposed between the first conductive semiconductor layer 30 and the second conductive semiconductor layer 50.

The first conductive semiconductor layer 30 has an uneven surface 35 formed at the interface with the active layer 40 to enhance the contact properties with the active layer 40. The second conductive semiconductor layer 50 has an uneven surface 55 formed at the interface with the transparent electrode 60 to enhance the contact properties with the transparent electrode 60.

The transparent electrode 60 has an uneven surface 65 formed at the interface with the non-conductive reflection film 91. Specifically, the uneven surface 65 of the transparent electrode 60 may be formed at the interface with the non-conductive reflection film other than the contact areas between the transparent electrode 60 and the interconnection electrodes 94.

The second conductive semiconductor layer 50 and the active layer 40 are mesa-etched in this order such that a portion of the first conductive semiconductor layer 30 is exposed. The order of the mesa etching may be changed. The n-type bonding pad 85 is disposed on the exposed portion of the first conductive semiconductor layer 30.

An electric current diffuses into the second conductive semiconductor layer 50 through the transparent electrode 60 formed on the second conductive semiconductor layer 50. The transparent electrode 60 has a thickness of 20 to 500 nm. The transparent electrode 60 may contain at least one of nickel (Ni), titanium (Ti), tungsten (W), silver (Ag), chromium (Cr), palladium (Pd), and molybdenum (Mo) or may be composed of at least one material selected from ITO, ZnO, and thin carbon structures.

The non-conductive reflection film 91 is formed on the transparent electrode 60. There is no restriction on the structure of the non-conductive reflection film 91. For example, the non-conductive reflection film 91 may be a single dielectric film composed of a light-transmitting dielectric material including at least one compound selected from $Si_xO_y$ (where x and y are positive integers), $Ti_mO_n$ (where m and n are positive integers), $Ta_2O_5$, and $MgF_2$. Specifically, the non-conductive reflection film 91 may be a single $SiO_2/TiO_2$ distributed Bragg reflector (DBR). Alternatively, the non-conductive reflection film 91 may consist of a plurality of different dielectric films or may be a combination of one or more dielectric films and one or more distributed Bragg reflectors. For example, the non-conductive reflection film 91 may consist of pairs of distributed Bragg reflectors having a total thickness of 0.05 to 2 μm, one of the pairs of distributed Bragg reflectors having a thickness of 40 to 200 nm. A dielectric film having a lower refractive index than the p-type semiconductor (e.g., GaN) layer 50 has the ability to reflect a portion of light with a critical angle or greater toward the substrate 10. A distributed Bragg reflector has the ability to reflect a larger amount of light toward the substrate 10. Accordingly, the non-conductive reflection film 91 can be designed to effectively reflect light at a particular wavelength in response to the wavelength of the light. When the thickness of each of the distributed Bragg reflectors corresponds to one-fourth of the wavelength of light to be reflected, the reflectance of the non-conductive reflection film 91 reaches a maximum. Accordingly, when a copper lead frame is used, the thickness of one of the pairs of distributed Bragg reflectors can be adjusted to 40 to 200 nm. That is, when it is desired to reflect UV light at 400 nm, the travel distance of the UV light in each layer should be 100 nm, which is divided by the refractive index of the layer to calculate the actual thickness of the layer. Since the reflectance of copper for UV light is only around 40%, the reflectance of light in the UV wavelength band from a copper or copper-plated lead frame is extremely low. Thus, when each of the distributed Bragg reflector is designed to have a thickness of 20 to 100 nm, the reflection efficiency of the non-conductive reflection film 91 for UV light increases, eventually resulting in an improvement in the overall reflectance of the light directed toward the substrate 10. That is, when an outer lead frame made of or plated with copper or gold is used, the non-conductive reflection film 91 is designed to have a reflectance of at least 80% for light at a wavelength of 400 nm.

The ohmic contact layers 71 are formed on the transparent electrode 60. The ohmic contact layers 71 form ohmic contacts between the transparent electrode 60 and the interconnection electrodes 94. The ohmic contacts function to improve the electrical conductivity of the p-type electrode branches and the contact properties between the transparent electrode 60 and the interconnection electrodes 94. The construction of the ohmic contact layers 71 will be described in more detail with reference to FIG. 2.

The plurality of via-holes 91-3 are formed in the non-conductive reflection film 91. The interconnection electrodes 94 are formed inside the via-holes 91-3 to electrically connect the reflective electrode 92 to the transparent electrode 60. The interconnection electrodes 94 are elements that are in direct contact with the ohmic contact layers 71 and are formed by filling an electrode material in the via-holes 91-3. The plurality of interconnection electrodes 94 are aligned in a matrix form, as explained below with reference to FIGS. 7 and 8. The p-type electrode branches thus formed increase the luminous efficiency of the semiconductor light emitting diode.

The reflective electrode 92 is formed on the non-conductive reflection film 91. The reflective electrode 92 serves as a p-type electrode while reflecting light irradiated from the active layer 40. The reflective electrode 92 is formed using a highly reflective metal, such as aluminum (Al) or silver (Ag). The reflective electrode 92 is formed on the non-conductive reflection film such that it comes into contact with the interconnection electrodes 94. The reflective electrode 92 may also be formed using chromium (Cr), titanium (Ti), nickel (Ni) or an alloy thereof, which is advantageous for stable electrical contact. The reflective electrode 92 is electrically connected to the outside such that holes are supplied to the p-type semiconductor layer 50 therethrough. Light not reflected by the non-conductive reflection film 91 is reflected from the reflective electrode 92.

As mentioned above, the semiconductor light emitting diode may be of a flip type. In this case, portions of the second conductive semiconductor layer and the active layer are exposed by mesa etching and the n-type bonding pad is disposed on the exposed portions, as illustrated in FIG. 1. Alternatively, the light emitting diode may be of a vertical type, which will be explained below with reference to FIG. 9. In this case, a substrate is removed by a suitable process, such as laser lift-off, and an n-type bonding pad is disposed instead of the substrate.

In this embodiment, the first conductive semiconductor layer 30 and the second conductive semiconductor layer 50 may be interchanged. The second conductive semiconductor layer 50 is typically composed of a nitride of Group III element, such as GaN. The n-type bonding pad 85 may be directly formed on the first conductive semiconductor layer 30, as illustrated in FIG. 1, or may be formed as an element of an n-type electrode unit 80 in the following fifth embodiment (see FIGS. 7 and 8).

The connection structures between the ohmic contact layers 71 and the interconnection electrodes 94 in the semiconductor light emitting diode of the present invention will be explained with reference to FIG. 2.

FIG. 2 illustrates enlarged cross-sectional views for explaining structures in which the interconnection electrodes 94 are connected to the transparent electrode 60 in FIG. 1. Specifically, (a), (b), and (c) of FIG. 2 illustrate first, second, and third examples of the ohmic contact layers, respectively.

As illustrated in (a) of FIG. 2, the interconnection electrode 94 is formed by filling a conductive material in the via-hole 91-3 formed in the non-conductive reflection film 91 and functions to connect the overlying reflective electrode 92 to the underlying ohmic contact layer 71.

The ohmic contact layer 71 contains at least one metal selected from nickel (Ni), gold (Au), palladium (Pd), titanium (Ti), platinum (Pt), silver (Ag), and tungsten (W). The ohmic contact layer functions to form an ohmic junction between the transparent electrode 60 and the interconnection electrode 94 to provide increased electrical conductivity therebetween.

The ohmic contact layer 71 is filled in a recess formed at a position of the transparent electrode 60 corresponding to the via-hole 91-3 by etching a portion of the transparent electrode 60, as illustrated in (a) of FIG. 2. Alternatively, the ohmic contact layer 71 may extend through the via-hole from the recess, as illustrated in (b) of FIG. 2. Alternatively, the ohmic contact layer 71 may be formed directly on the transparent electrode 60 without the need to form a recess in the transparent electrode by etching, as illustrated in (c) of FIG. 2. The ohmic contact layer 71 may be formed in only a portion of a recess formed in the transparent electrode by etching. Here, the recess may be formed by partial etching of the transparent electrode 60, i.e. during etching for the formation of the via-hole 91-3, or by direct etching of the transparent electrode 60.

With reference to a plan view of the first embodiment of the semiconductor light emitting diode according to the present invention, a description will be given concerning the structures of the interconnection electrodes 94 and the n-type bonding pad 80.

Figure 3:
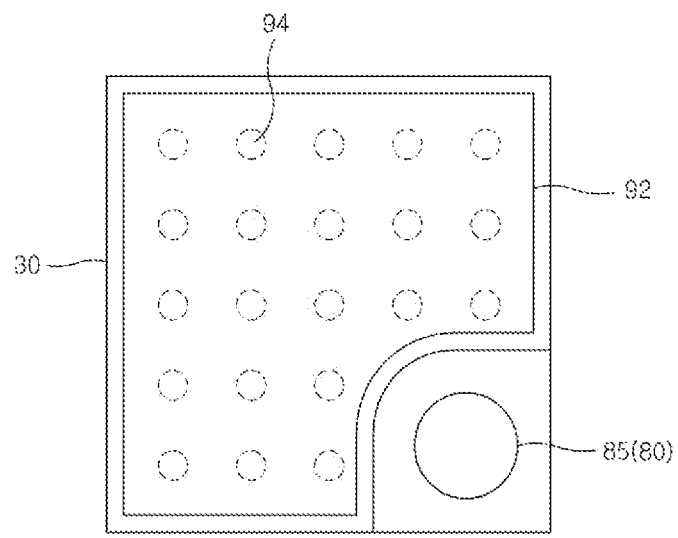
FIG. 3 is a plan view of the semiconductor light emitting diode illustrated in FIG. 1.

FIG. 3 is a plan view of the semiconductor light emitting diode illustrated in FIG. 1. As illustrated in FIG. 3, the semiconductor light emitting diode is substantially quadrangular in plan. The n-type bonding pad 85 is disposed at one edge of the semiconductor light emitting diode and the interconnection electrodes 94 filled in the via-holes 91-3 are aligned in a matrix form in the remaining portion of the semiconductor light emitting diode. With this arrangement, a flow of electric current is improved, ensuring good luminous efficiency in the active layer 40.

Second and third embodiments of the semiconductor light emitting diode according to the present invention will be explained with reference to FIGS. 4 and 5.

Figure 4:
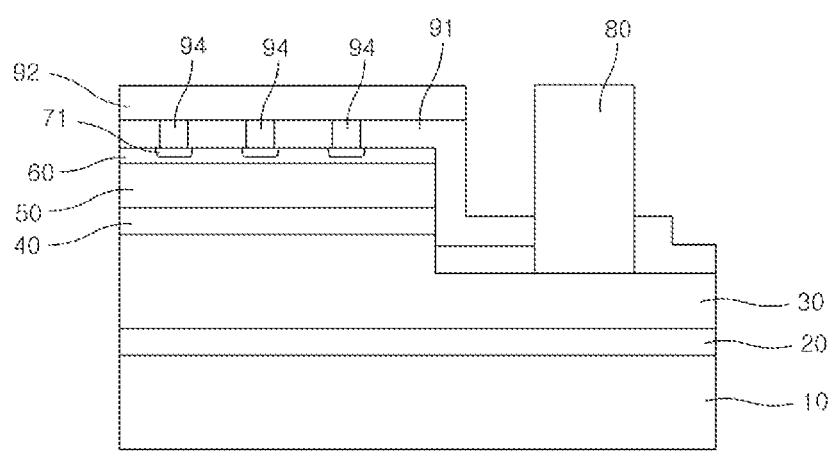
FIG. 4 is a cross-sectional view of a second embodiment of a semiconductor light emitting diode according to the present invention.

Specifically, FIGS. 4 and 5 are cross-sectional views of second and third embodiments of the semiconductor light emitting diode according to the present invention, respectively. The same reference numerals are given to the same elements in the second embodiment as those in the first embodiment, and thus a description thereof is omitted for simplicity of description.

Unlike in the first embodiment, the height of the n-type bonding pad 85 is substantially the same as that of the reflective electrode 92 in the second embodiment. With these dimensions, the flip-type light emitting diode can be attached to a lead frame or an electrode on a circuit board, for example, using solder balls.

As illustrated in FIG. 4, the flip-type semiconductor light emitting diode does not suffer from optical loss caused by bonding wires because it is mounted without bonding wires. Furthermore, light (particularly in the UV region) irradiated onto a lead frame is reflected from the distributed Bragg reflectors of the non-conductive reflection film 91, resulting in a marked improvement in the light output characteristics of the semiconductor light emitting diodes as a whole.

FIG. 5 is a cross-sectional view of a third embodiment of the semiconductor light emitting diode according to the present invention. As illustrated in FIG. 5, the third embodiment is distinguished from the first and second embodiments in that the substrate 10 and the buffer layer 20 are removed. Suitable processes, such as laser lift-off and etching, can be applied to the removal of the substrate 10 and the buffer layer 20. The first conductive semiconductor layer 30 is the lowermost layer in the structure of the third embodiment. As in the second embodiment, the n-type bonding pad 80 has substantially the same height as the reflective electrode 92 in the third embodiment. With these dimensions, the flip-type light emitting diode can be attached to a lead frame or an electrode on a circuit board, for example, using solder balls.

Figure 6:
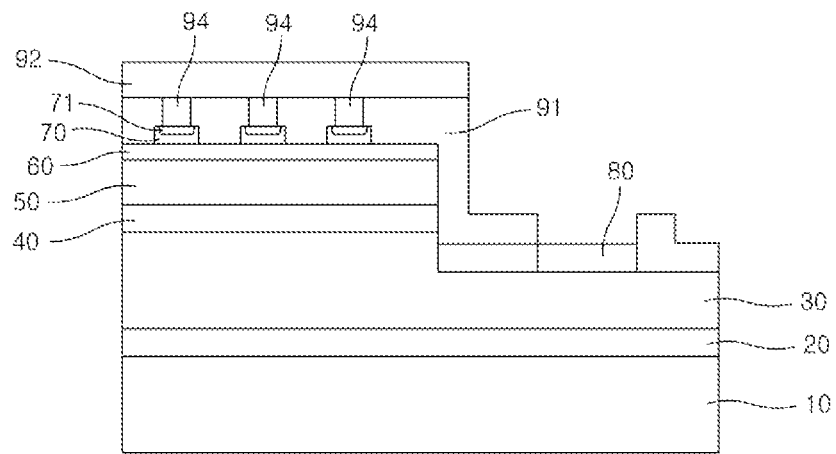
FIG. 6 is a cross-sectional view of a fourth embodiment of a semiconductor light emitting diode according to the present invention.

Referring to FIG. 6, a description will be given concerning a fourth embodiment of the semiconductor light emitting diode according to the present invention.

FIG. 6 is a cross-sectional view of a fourth embodiment of the semiconductor light emitting diode according to the present invention. Unlike the first embodiment, the fourth embodiment further includes connection electrodes 70. As illustrated in FIG. 6, each of the connection electrodes 70 may include the ohmic contact layer 71. Alternatively, each of the connection electrodes 70 may be the ohmic contact layer 71. In the fourth embodiment, the transparent electrode 60 and the connection electrodes 70 are sequentially formed and the uppermost layers of the connection electrodes 70 form the ohmic contact layers 71, which are in direct contact with the interconnection electrodes 94.

Figure 7:
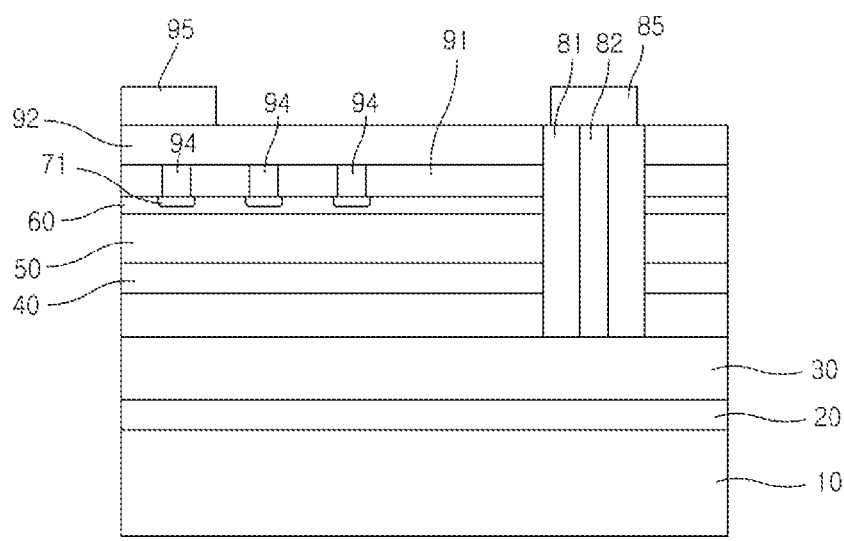
FIG. 7 is a cross-sectional view of a fifth embodiment of a semiconductor light emitting diode according to the present invention.
Figure 8:
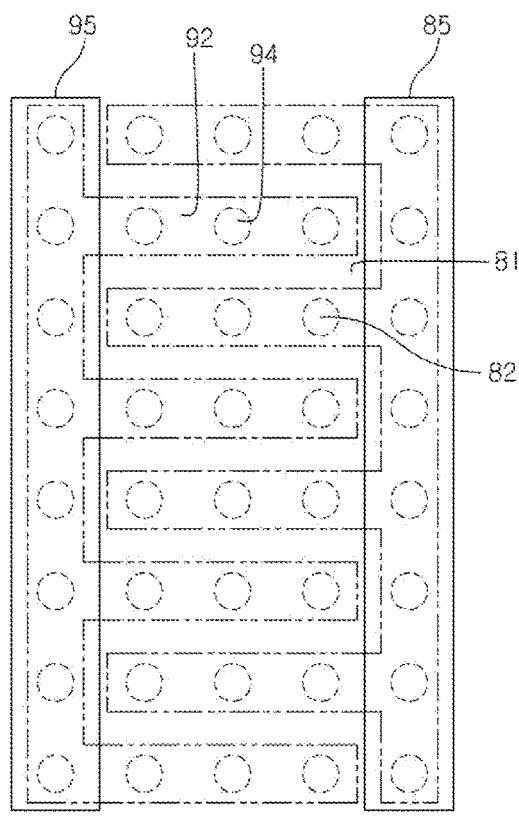
FIG. 8 is a plan view of the semiconductor light emitting diode illustrated in FIG. 7.

Referring to FIGS. 7 and 8, a description will be given concerning a fifth embodiment of the semiconductor light emitting diode according to the present invention.

Specifically, FIGS. 7 and 8 are cross-sectional and plan views of a fifth embodiment of the semiconductor light emitting diode according to the present invention, respectively.

The same reference numerals are given to the same elements in the fifth embodiment as those in the first to fourth embodiments, and thus a description thereof is omitted.

The fifth embodiment is distinguished from the first to fourth embodiments in that n-type electrodes 82 are engaged with the interconnection electrodes 94. For this arrangement, the semiconductor light emitting diode of the present invention includes an n-type electrode unit, as illustrated in FIG. 7. The n-type electrode unit 80 may be formed on the first conductive semiconductor layer 30 after removal of portions of the active layer 40, the second conductive semiconductor layer 50, the non-conductive reflection film 91, etc. by etching. The n-type electrode unit 80 may include an n-type electrode insulating layer 81, n-type electrodes 82 filled in via-holes formed in the n-type electrode insulating layer 81, and an n-type bonding pad 85 arranged over the n-type electrodes 82 and the n-type electrode insulating layer 81. The n-type electrodes 82 and the interconnection electrodes 94 are engaged with each other and are arranged in a matrix structure. Specifically, the reflective electrode branches disposed on the n-type electrodes 82 are engaged with the reflective electrode branches disposed on the interconnection electrodes 94.

As illustrated in FIG. 7, a portion of a laminate of the first conductive semiconductor layer 30, the second conductive semiconductor layer 50, the transparent electrode 60, the non-conductive reflection film 91, and the reflective electrode 92 is removed by etching to form a hole. The n-type electrode insulating layer 81 is formed on the inner surface of the hole to insulate the n-type electrodes from the second conductive semiconductor layer. Then, the bottom of the n-type electrode insulating layer 81 is etched to form holes through which the underlying first conductive semiconductor layer 30 can be electrically connected to the outside, and thereafter, the n-type electrodes 82 are formed in the holes. As a result, the n-type electrodes 82 are electrically connected to the first conductive semiconductor layer through the holes. Then, the n-type bonding pad 85 is formed over the n-type electrodes 82 and the n-type electrode insulating layer 81. In the n-type electrode unit 80 thus constructed, the p-type reflective electrode 92 and the n-type electrodes 82 are aligned in a matrix form in which the reflective electrode 92 is engaged with the n-type electrodes 82.

The structures of the p-type electrode branches and the n-type electrode unit 80 will be explained with reference to the plan view of the fifth embodiment of the semiconductor light emitting diode (FIG. 8).

As illustrated in FIG. 8, the semiconductor light emitting diode is substantially quadrangular in plan. The interconnection electrodes 94 filled in the via-holes 91-3 and the n-type electrodes 82 are aligned in a matrix form in which they are engaged with each other. That is, the interconnection electrodes 94 and the n-type electrodes 82 have finger shapes and are engaged with each other.

Thus, an electric current is allowed to smoothly flow along current paths formed through the transparent electrode 60, the second conductive semiconductor layer 50, the active layer 40, the first conductive semiconductor layer 30, and the n-type electrodes 82 from the interconnection electrodes 94.

A p-type bonding member 95 is attached to one side of the reflective electrode 92 arranged on the interconnection electrodes 94, the n-type electrode insulating layer 81 is formed around the n-type electrodes 82, and an n-type bonding member is spaced apart from the p-type bonding member 95 over the n-type electrode 82 and the n-type electrode insulating layer 81.

Referring next to FIGS. and 10, a description will be given concerning a sixth embodiment of the semiconductor light emitting diode according to the present invention. The sixth embodiment of the semiconductor light emitting diode is of a vertical type, unlike the foregoing first to fifth embodiments.

Figure 9:
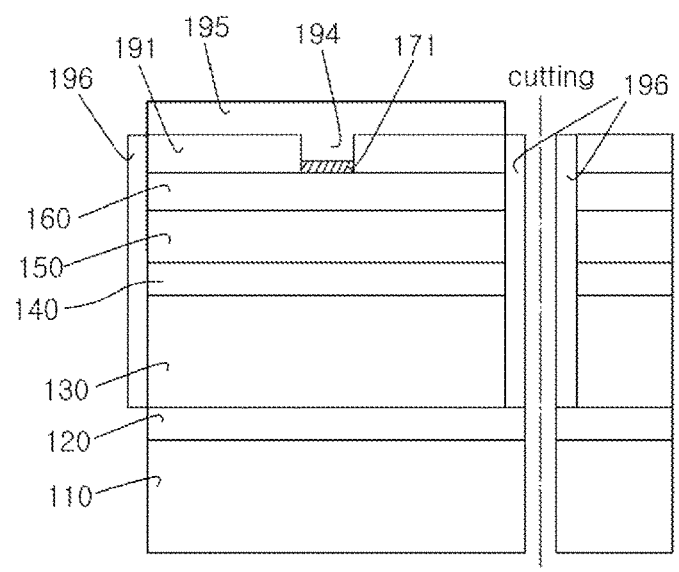
FIGS. 9 and 10 are cross-sectional views of a sixth embodiment of a semiconductor light emitting diode according to the present invention.
Figure 10:
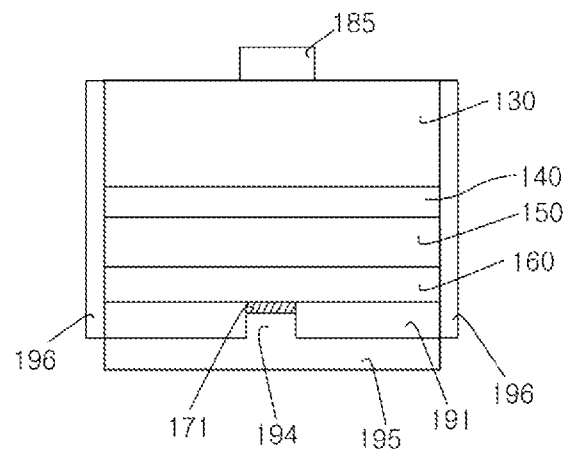

Referring to both FIGS. 9 and 10, the sixth embodiment of the semiconductor light emitting diode according to the present invention includes a first conductive semiconductor layer 130 having an upper surface and a lower surface, a second conductive semiconductor layer 150 spaced apart from the upper surface of the first conductive semiconductor layer 130, an active layer 140 disposed between the upper surface of the first conductive semiconductor layer 130 and the second conductive semiconductor layer 150, a transparent electrode 160 formed on the second conductive semiconductor layer 150, a non-conductive reflection film 191 covering the circumferential surface of the transparent electrode 160 and having one or more via-holes formed therein, a first conductive electrode pad 185 formed on the lower surface of the first conductive semiconductor layer 130, a second conductive electrode pad 195 formed on the non-conductive reflection film 191, interconnection electrodes 194 filled in the via-holes and electrically connecting the second conductive electrode pad 195 to the transparent electrode 160, and ohmic contact layers 171 formed between the transparent electrode 160 and the interconnection electrodes 194 and filled in recesses formed at positions of the transparent electrode corresponding to the via-holes by etching or extending through the via-holes from the recesses.

In the vertical-type semiconductor light emitting diode, the first conductive semiconductor layer 185 is formed opposite the second conductive semiconductor layer 195. In FIG. 9, the side of the first conductive semiconductor layer 130 toward the bottom is defined as the lower surface of the first conductive semiconductor layer 130 and the side of the first conductive semiconductor layer 130 toward the top is defined as the upper surface of the first conductive semiconductor layer 130 for convenience. After removal of the buffer layer 120 and the substrate 110 disposed at the lower surface of the first conductive semiconductor layer 130 by a suitable process, such as laser lift-off or etching, the first conductive electrode pad 185 is formed on the lower surface of the first conductive semiconductor layer 130 (see FIG. 10). The buffer layer 120 and the substrate 110 are removed by cutting along the cutting line shown in FIG. 9.

The structures of the via-holes formed in the transparent electrode 160, the interconnection electrodes 194 filled in the via-holes, and the ohmic contact layers 171 are substantially the same as those described in the first embodiment with reference to FIG. 2, and thus a detailed description thereof is omitted to avoid duplication. The first conductive semiconductor layer 130, the second conductive semiconductor layer 150, the active layer 140, the transparent electrode 160, and the non-conductive reflection film 191 are the same as those described in the first embodiment with reference to FIG. 1, and thus a detailed description thereof is omitted to avoid duplication.

The sixth embodiment of the semiconductor light emitting diode according to the present invention further includes a passivation layer 196 covering one side of the first conductive semiconductor layer 130, one side of the second conductive semiconductor layer 150, one side of the transparent electrode 160, and one side of the non-conductive reflection film 191, as illustrated in FIGS. 9 and 10. The passivation layer 196 insulates and protects the semiconductor light emitting diode.

As illustrated, the interconnection electrodes 194 filled in the via-holes of the non-conductive reflection film 191 may be formed integrally with the second conductive electrode pad 195. In this case, the interconnection electrodes 194 are composed of the same material as the second conductive electrode pad 195. Alternatively, the interconnection electrodes 194 are formed by filling a conductive material different from a material for the second conductive electrode pad 195 in the via-holes, and then the second conductive electrode pad 195 is disposed thereon, as in the first embodiment. Light not reflected by the non-conductive reflection film 191 may be further reflected from the second conductive electrode pad 195.

Figure 11:
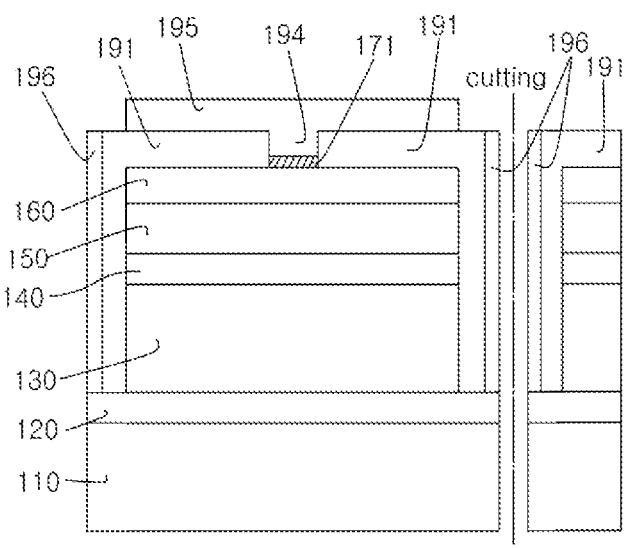
FIGS. 11 and 12 are cross-sectional views of a seventh embodiment of a semiconductor light emitting diode according to the present invention.
Figure 12:
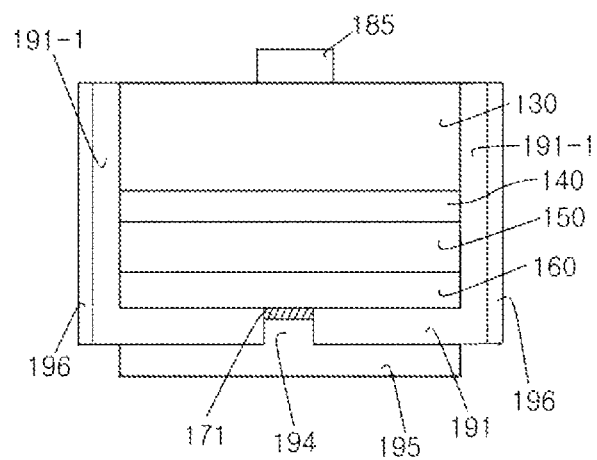

Referring next to FIGS. 11 and 12, a description will be given concerning a seventh embodiment of the semiconductor light emitting diode according to the present invention. The seventh embodiment of the semiconductor light emitting diode is distinguished from the sixth embodiment in that a non-conductive lateral reflection film 191-1 is further formed before formation of the passivation layer 196, and its other elements are substantially the same as those of the sixth embodiment. That is, in the seventh embodiment of the semiconductor light emitting diode, the non-conductive lateral reflection film 191-1 covers one side of the first conductive semiconductor layer 130, one side of the active layer 140, one side of the second conductive semiconductor layer 150, one side of the transparent electrode 160, and one side of the non-conductive reflection film 191, and the passivation layer 196 is formed on the non-conductive lateral reflection film 191-1. The non-conductive lateral reflection film 191-1 can reflect light emitted laterally from the active layer 140.

As is apparent from the above description, according to the foregoing embodiments of the semiconductor light emitting diode according to the present invention, the interconnection electrodes filled in the via-holes and the ohmic contact layers formed between the interconnection electrodes and the transparent electrode ensure increased conductivity, achieving maximum luminous efficiency of the semiconductor light emitting diode. In addition, the formation of the non-conductive reflection film with high reflectance for light in the UV region contributes to excellent light output characteristics of the semiconductor light emitting diode. Excellent light output characteristics of the semiconductor light emitting diode can be obtained also when a lead frame plated with copper or gold is provided. Furthermore, ohmic contacts are formed between the transparent electrode composed of a conductive oxide and the interconnection electrodes composed of a metal material and defects are minimized during fabrication of the semiconductor light emitting diode, achieving good bonding between the transparent electrode and the interconnection electrodes. Moreover, it is expected that the structures and fabrication methods of the embodiments of the semiconductor light emitting diode according to the present invention are applicable to micro-LEDs (µ-LEDs) for full-color emission.

EXPLANATION OF REFERENCE NUMERALS 10, 110: Substrates
20, 120: Buffer layers
30, 130: First conductive semiconductor layers
40, 140: Active layers
50, 150: Second conductive semiconductor layers
60, 160: Transparent electrodes
70: Connection electrode
71, 171: Ohmic contact layers
80: n-type electrode unit
91: Non-conductive reflection film
92: Reflective electrode
94, 194: Interconnection electrodes
185: First conductive electrode pad
191-1: Non-conductive lateral reflection film
195: Second conductive electrode pad
196: Passivation layer

The invention claimed is:
1. A semiconductor light emitting diode comprising:
a first conductive semiconductor layer,
a second conductive semiconductor layer,
an active layer disposed between the first conductive semiconductor layer and the second conductive semiconductor layer,
a transparent electrode formed on the second conductive semiconductor layer,
a non-conductive reflection film covering a circumferential surface of the transparent electrode and having one or more via-holes formed therein,
a reflective electrode formed on the non-conductive reflection film,
interconnection electrodes filled in the via-holes and electrically connecting the reflective electrode to the transparent electrode, and
ohmic contact layers formed between the transparent electrode and the interconnection electrodes,
wherein a reflectance of the non-conductive reflection film for light at a wavelength of 400 nm is at least 80%,
wherein the non-conductive reflection film comprises first type of layers and second type of layers, the first type of layer and the second type of layer being stacked alternately, and
wherein the ohmic contact layers are filled in recesses formed by etching a portion of the transparent electrode corresponding to the via-holes.

2. The semiconductor light emitting diode according to claim 1, wherein the first type of layers comprise titanium dioxide ($TiO_2$) and the second type of layers comprise silicon dioxide ($SiO_2$).

3. The semiconductor light emitting diode according to claim 2, wherein a pair of the first type of layer and the second type of layer has a thickness of 40 to 200 nm to reflect ultraviolet (UV) light emitted from the active layer.

4. The semiconductor light emitting diode according to claim 3, wherein the transparent electrode comprises indium tin oxide (ITO), zinc oxide (ZnO) or a metal layer having a transmittance of at least 90% for light at a wavelength of 400 nm.

5. The semiconductor light emitting diode according to claim 1, wherein the transparent electrode has a thickness of 20 to 500 nm and contains at least one of nickel (Ni), titanium (Ti), tungsten (W), silver (Ag), chromium (Cr), palladium (Pd), and molybdenum (Mo).

6. The semiconductor light emitting diode according to claim 1, wherein non-conductive reflection film is composed of a light-transmitting material comprising at least one compound selected from $Si_xO_y$ (where x and y are positive integers), $Ti_mO_n$ (where m and n are positive integers), $Ta_2O_5$, and $MgF_2$.

7. The semiconductor light emitting diode according to claim 1, further comprising an n-type electrode unit arranged on the first conductive semiconductor layer.

8. The semiconductor light emitting diode according to claim 7, wherein the n-type electrode unit comprises an n-type electrode insulating layer, n-type electrodes filled in via-holes formed in the n-type electrode insulating layer, and an n-type bonding member arranged over the n-type electrode insulating layer and the n-type electrodes.

9. The semiconductor light emitting diode according to claim 8, wherein the n-type electrodes and the interconnection electrodes are aligned in a matrix structure.

10. The semiconductor light emitting diode according to claim 9, wherein the n-type electrodes and the interconnection electrodes form an engaged structure.

* * * * *